(12) United States Patent
Cheng et al.

(10) Patent No.: US 12,207,448 B2
(45) Date of Patent: Jan. 21, 2025

(54) AIRFLOW GUIDING MECHANISM AND ELECTRONIC DEVICE

(71) Applicant: Wistron Corporation, New Taipei (TW)

(72) Inventors: Yu-Chia Cheng, New Taipei (TW); Chien-Hsiang Chueh, New Taipei (TW)

(73) Assignee: Wistron Corporation, New Taipei (TW)

( * ) Notice: Subject to any disclaimer, the term of this patent is extended or adjusted under 35 U.S.C. 154(b) by 301 days.

(21) Appl. No.: 17/711,063

(22) Filed: Apr. 1, 2022

(65) Prior Publication Data

US 2023/0262944 A1    Aug. 17, 2023

(30) Foreign Application Priority Data

Feb. 14, 2022   (TW) .................................. 111105293

(51) Int. Cl.

| G06F 1/16 | (2006.01) |
|---|---|
| G06F 1/18 | (2006.01) |
| G06F 1/20 | (2006.01) |
| H05K 5/00 | (2006.01) |
| H05K 7/00 | (2006.01) |
| H05K 7/20 | (2006.01) |

(52) U.S. Cl.
CPC ......... *H05K 7/20618* (2013.01); *G06F 1/181* (2013.01); *G06F 1/20* (2013.01); *H05K 7/20554* (2013.01); *G06F 1/183* (2013.01)

(58) Field of Classification Search
CPC ............ H05K 7/20618; H05K 7/20554; G06F 1/181; G06F 1/20; G06F 1/183
See application file for complete search history.

(56) References Cited

U.S. PATENT DOCUMENTS

| 7,656,660 B2* | 2/2010 | Hoeft | ................. H05K 7/20745 181/224 |
|---|---|---|---|
| 9,915,985 B1* | 3/2018 | Chen | .................. H05K 7/20736 |
| 9,961,796 B1* | 5/2018 | Peng | .................. H05K 7/20727 |
| 10,334,753 B2* | 6/2019 | Chu | .................... H05K 7/20145 |
| 10,653,040 B1* | 5/2020 | Wang | ................. H05K 7/20727 |
| 11,229,145 B2* | 1/2022 | Peng | .................. H05K 7/20727 |

(Continued)

FOREIGN PATENT DOCUMENTS

| TW | 201212770 A1 | 3/2012 |
|---|---|---|
| TW | 201227240 | 7/2012 |
| TW | 201328574 | 7/2013 |

*Primary Examiner* — Anthony M Haughton
(74) *Attorney, Agent, or Firm* — Winston Hsu

(57) ABSTRACT

An airflow guiding mechanism includes a housing and a shielding assembly. The housing includes an airflow guiding portion and a guiding track. The shielding assembly is movably connected to the guiding track. The shielding assembly is able to move within the airflow guiding portion along the guiding track. In an embodiment, the shielding assembly may include a first shielding plate and at least one second shielding plate. The first shielding plate is connected to the housing. The at least one second shielding plate and the first shielding plate are movably connected to each other. The at least one second shielding plate are able to move with respect to each other to be folded and unfolded, so as to open and shield the airflow guiding portion.

9 Claims, 13 Drawing Sheets

(56) References Cited

U.S. PATENT DOCUMENTS

| | | | |
|---|---|---|---|
| 2004/0252453 A1* | 12/2004 | Brooks | H05K 7/20718 361/679.51 |
| 2009/0034190 A1* | 2/2009 | Tsai | H05K 7/20145 361/695 |
| 2011/0189935 A1* | 8/2011 | Chou | F24F 13/00 454/284 |
| 2011/0220323 A1* | 9/2011 | Tan | G06F 1/20 165/96 |
| 2016/0299542 A1* | 10/2016 | Cho | H05K 7/20145 |
| 2018/0095508 A1* | 4/2018 | Yi | H05K 7/20163 |

* cited by examiner

AIRFLOW GUIDING MECHANISM AND ELECTRONIC DEVICE

BACKGROUND OF THE INVENTION

1. Field of the Invention

The invention relates to an airflow guiding mechanism and, more particularly, to an airflow guiding mechanism capable of effectively improving heat dissipating efficiency and an electronic device equipped with the airflow guiding mechanism.

2. Description of the Prior Art

As technology advances and develops, various electronic devices (e.g. computer, server, etc.) are considered a necessity by a lot of people in their daily lives. To provide various functions for the electronic device, there are usually a lot of slots in the electronic device for installing some interface cards, such as link control card (LCC), sound card, graphic accelerator card, network card, etc., so as to enhance additional functions. In general, the interface card is disposed in a wind hood and a fan is disposed in front of the wind hood, so as to use the wind hood to guide an airflow generated by the fan to the interface card for heat dissipation. However, when there is no interface card installed at some positions within the wind hood, the airflow will lose from those positions, such that the heat dissipating efficiency reduces. At present, some wind hoods are equipped with a shielding plate to prevent the airflow from losing. However, the position of the shielding plate is fixed and cannot be adjusted according to the interface cards with different sizes. When a user wants to replace the interface cards with different sizes, the user needs to replace the wind hood or adds additional shielding component at the same time, such that it is quite inconvenient in use and wastes additional cost.

SUMMARY OF THE INVENTION

The invention provides an airflow guiding mechanism capable of effectively improving heat dissipating efficiency and an electronic device equipped with the airflow guiding mechanism, so as to solve the aforesaid problems.

According to an embodiment of the invention, an airflow guiding mechanism comprises a housing and a shielding assembly. The housing comprises an airflow guiding portion and a guiding track. The shielding assembly is movably connected to the guiding track. The shielding assembly is able to move within the airflow guiding portion along the guiding track.

According to another embodiment of the invention, an airflow guiding mechanism comprises a housing and a shielding assembly. The housing comprises an airflow guiding portion. The shielding assembly comprises a first shielding plate and at least one second shielding plate. The first shielding plate is connected to the housing. The at least one second shielding plate and the first shielding plate are movably connected to each other. The at least one second shielding plate is able to move with respect to the first shielding plate to be folded and unfolded, so as to open and shield the airflow guiding portion.

According to another embodiment of the invention, an electronic device comprises a casing and an airflow guiding mechanism. The airflow guiding mechanism is disposed in the casing. The airflow guiding mechanism comprises a housing and a shielding assembly. The housing comprises an airflow guiding portion and a guiding track. The shielding assembly is movably connected to the guiding track. The shielding assembly is able to move within the airflow guiding portion along the guiding track.

As mentioned in the above, the shielding assembly of the invention is movably connected to the guiding track of the housing, such that the shielding assembly is able to move within the airflow guiding portion along the guiding track. Accordingly, a user may adjust the position of the shielding assembly according to interface cards with different sizes. In an embodiment, the shielding assembly may comprise a first shielding plate and at least one second shielding plate movably connected to each other. When there is an interface card installed at a position corresponding to the shielding assembly, the at least one second shielding plate will be pushed by the interface card to be folded to open the guiding portion. On the other hand, when there is no interface card installed at a position corresponding to the shielding assembly, the at least one second shielding plate will be unfolded due to its own weight to shield the guiding portion. Accordingly, the invention can prevent the airflow from losing from the position without an interface card, so as to effectively improve heat dissipating efficiency.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
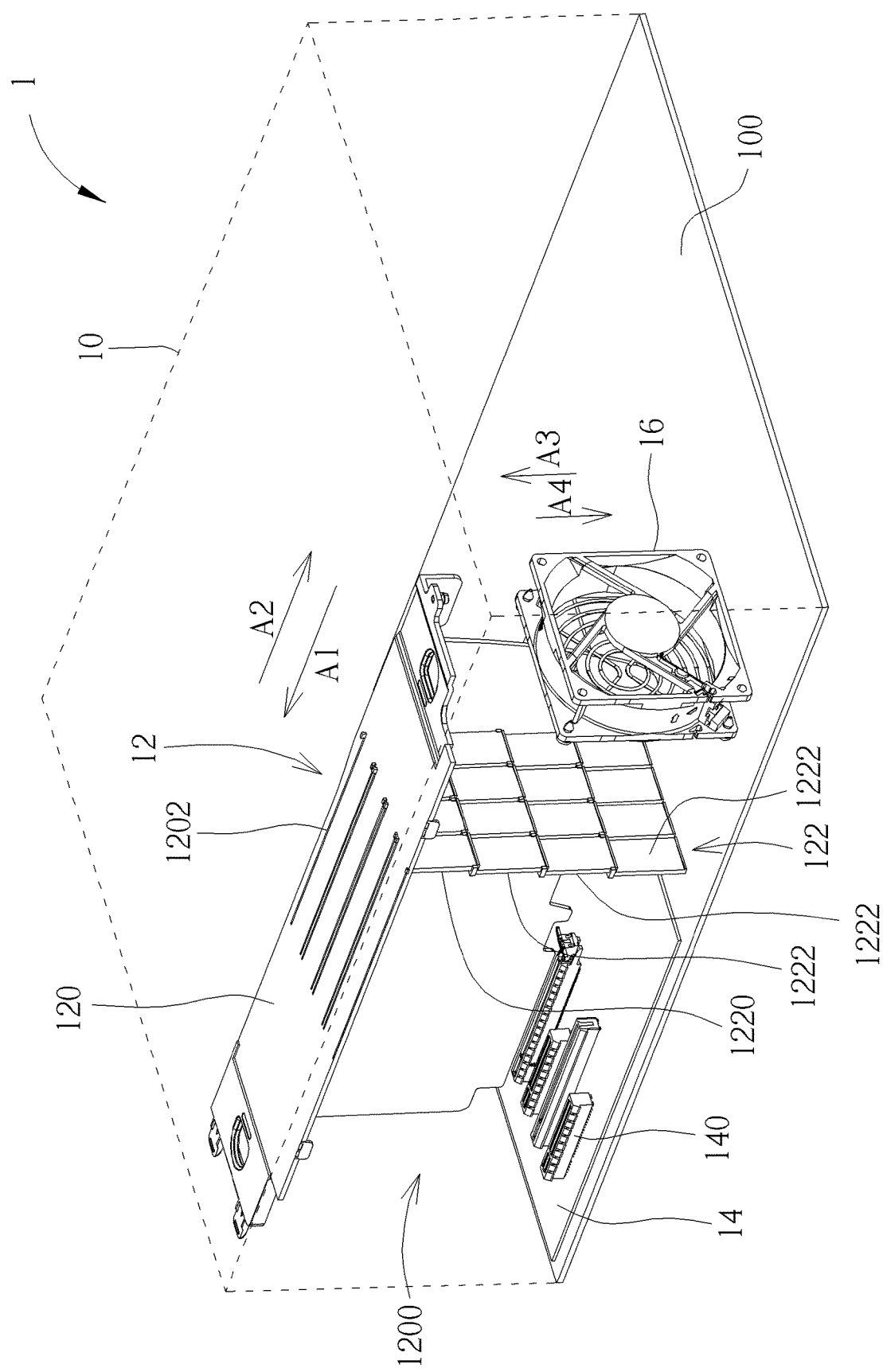
FIG. 1 is a perspective view illustrating an electronic device according to an embodiment of the invention.
Figure 2:
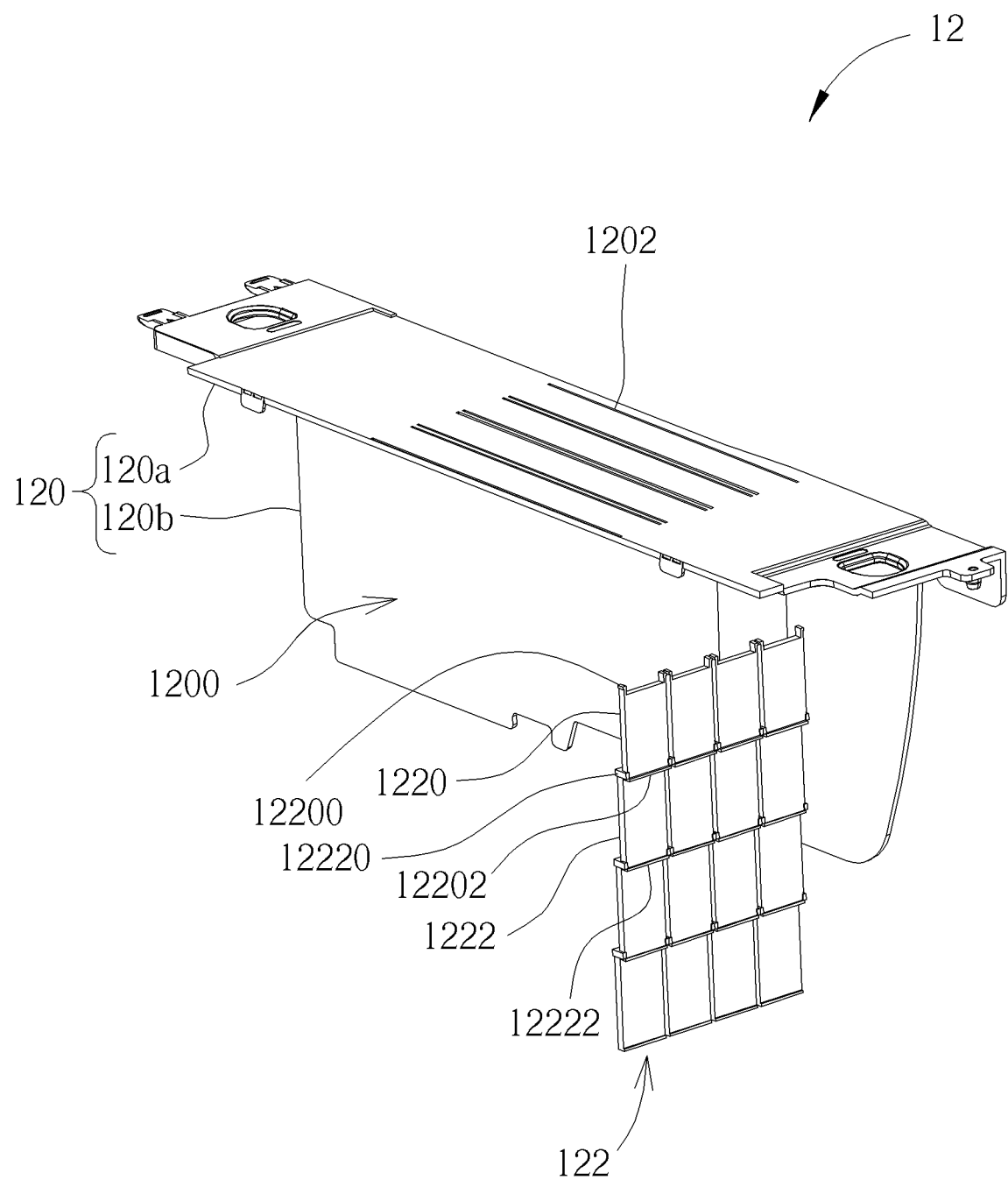
FIG. 2 is an exploded view illustrating an airflow guiding mechanism shown in FIG. 1.
Figure 3:
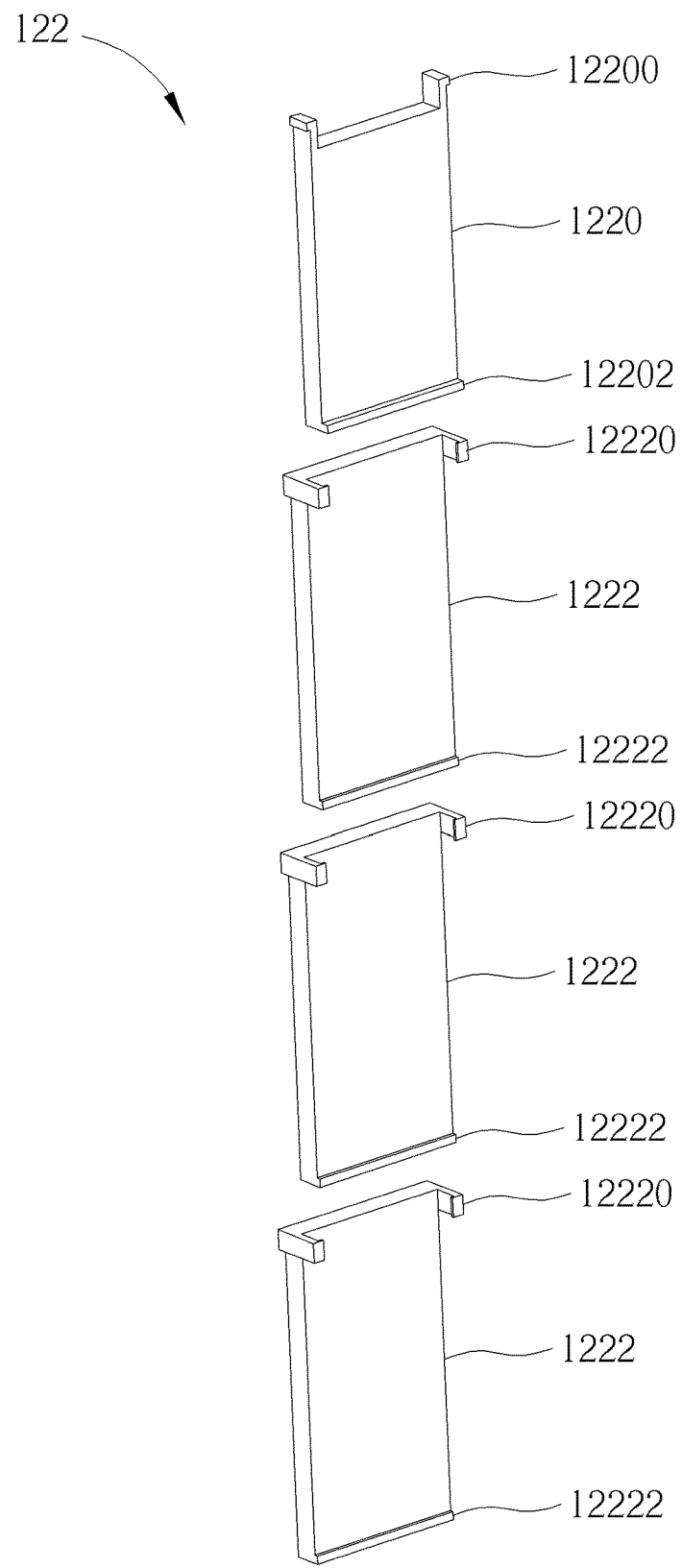
FIG. 3 is an exploded view illustrating a shielding assembly shown in FIG. 2.

Referring to FIGS. 1 to 3, FIG. 1 is a perspective view illustrating an electronic device 1 according to an embodiment of the invention, FIG. 2 is an exploded view illustrating an airflow guiding mechanism 12 shown in FIG. 1, and FIG. 3 is an exploded view illustrating a shielding assembly 122a shown in FIG. 2.

As shown in FIGS. 1 to 3, the electronic device 1 comprises a casing 10, an airflow guiding mechanism 12, a circuit board 14 and a fan 16. The airflow guiding mechanism 12, the circuit board 14 and the fan 16 are disposed in the casing 10, wherein the airflow guiding mechanism 12 is disposed on the circuit board 14 and the fan 16 is disposed in front of the airflow guiding mechanism 12. The electronic device 1 may be a computer, a server or other electronic devices capable of installing an interface card according to practical applications. The interface card may be a link control card (LCC), a sound card, a graphic accelerator card, a network card or other expansion cards. In general, the electronic device 1 may be further equipped with some necessary hardware and/or software components for specific purposes, such as processor, memory, power supply, applications, communication module, etc., and it depends on practical applications. Furthermore, the casing 10 shown in FIG. 1 is illustrated by dotted line and the appearance of the casing 10 may be designed according to practical applications.

The airflow guiding mechanism 12 comprises a housing 120 and a shielding assembly 122. The housing 120 comprises an airflow guiding portion 1200 and a guiding track 1202. In this embodiment, the housing 120 may comprise a top plate 120a and a side plate 120b, wherein the side plate 120b is connected to a side of the top plate 120a and the guiding track 1202 is disposed on the top plate 120a. When the airflow guiding mechanism 12 is disposed in the casing 10, the airflow guiding portion 1200 may be formed and surrounded by the top plate 120a, the side plate 120b and a side wall 100 of the casing 10. In another embodiment, the housing may comprise a top plate and two side plates, wherein the two side plates are connected to opposite sides of the top plate. At this time, the airflow guiding portion may be formed and surrounded by the top plate and the two side plates.

The shielding assembly 122 is movably connected to the guiding track 1202, such that the shielding assembly 122 is able to move within the airflow guiding portion 1200 along the guiding track 1202. In this embodiment, the airflow guiding mechanism 12 may comprise four shielding assemblies 122 and the housing 120 may comprise four guiding tracks 1202, wherein each of the shielding assemblies 122 is movably connected to the corresponding guiding track 1202. Furthermore, the circuit board 14 may comprise four slots 140 for installing four interface cards. The four shielding assemblies 122 are respectively disposed with respect to the four slots 140. It should be noted that the number of the shielding assemblies 122, the guiding tracks 1202 and the slots 140 may be determined according to practical applications, so the invention is not limited to the embodiment shown in the figures.

The shielding assembly 122 may comprise a first shielding plate 1220 and at least one second shielding plate 1222, wherein the first shielding plate 1220 is movably connected to the guiding track 1202, and the at least one second shielding plate 1222 and the first shielding plate 1220 are movably connected to each other. Accordingly, the at least one second shielding plate 1222 is able to move with respect to each other to be folded and unfolded to open and shield the airflow guiding portion 1200. As shown in FIG. 1, the first shielding plate 1220 may move along the guiding track 1202 in the directions of the arrows A1, A2, and the second shielding plate 1222 may move in the directions of the arrows A3, A4. In other words, a moving direction of the second shielding plate 1222 is perpendicular to a moving direction of the first shielding plate 1220 along the guiding track 1202. In this embodiment, the shielding assembly 122 may comprise three second shielding plates 1222, but the invention is not so limited. The number of the second shielding plates 1222 may be determined according to practical applications.

The first shielding plate 1220 may comprise a first engaging structure 12200 and a flange 12202, wherein the first engaging structure 12200 and the flange 12202 are located at opposite sides of the first shielding plate 1220. The first engaging structure 12200 is movably engaged with the guiding track 1202, such that the first shielding plate 1220 is movably connected to the guiding track 1202. In this embodiment, the guiding track 1202 may comprise two sliding grooves in parallel and the first engaging structure 12200 may comprise two opposite engaging hooks. The two engaging hooks are disposed in the two sliding grooves, such that the first engaging structure 12200 is movably engaged with the guiding track 1202.

Each of the second shielding plates 1222 comprises a second engaging structure 12220 and a flange 12222, wherein the second engaging structure 12220 and the flange 12222 are located at opposite sides of the second shielding plate 1222. Each of the second shielding plates 1222 and the first shielding plate 1220 may be movably engaged with each other by the second engaging structure 12220. In this embodiment, the second engaging structure 12220 may comprise two opposite engaging hooks. The second shielding plate 1222 and the first shielding plate 1220 may be sandwiched in between the two engaging hooks correspondingly, such that each of the second shielding plates 1222 and the first shielding plate 1220 are movably engaged with each other by the second engaging structure 12220. As shown in FIG. 2, when each of the second shielding plates 1222 is unfolded, the flanges 12202, 12222 will stop the second engaging structure 12220 to restrain each of the second shielding plates 1222.

Figure 4:
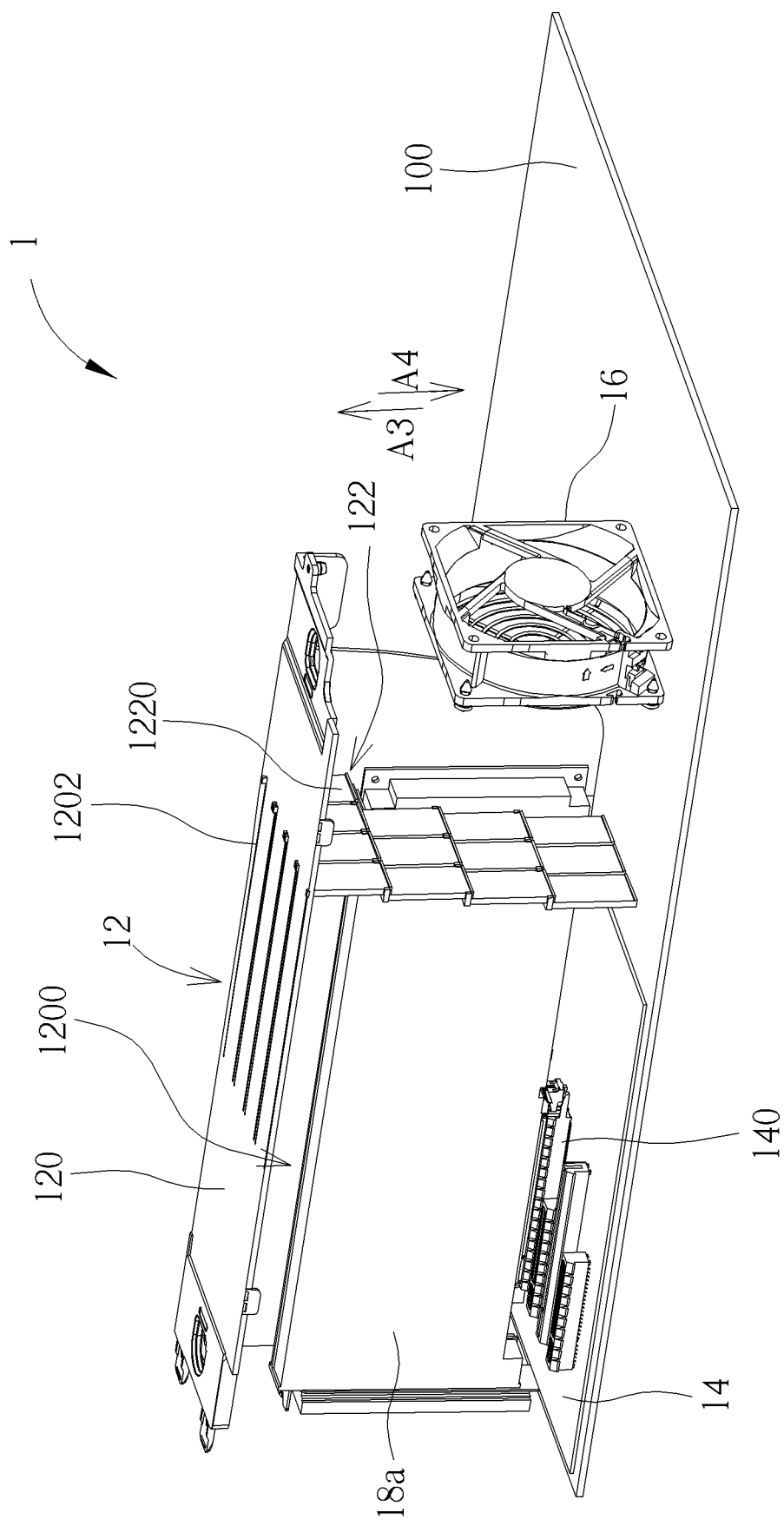
FIG. 4 is a perspective view illustrating an interface card installed at the corresponding slot.
Figure 5:
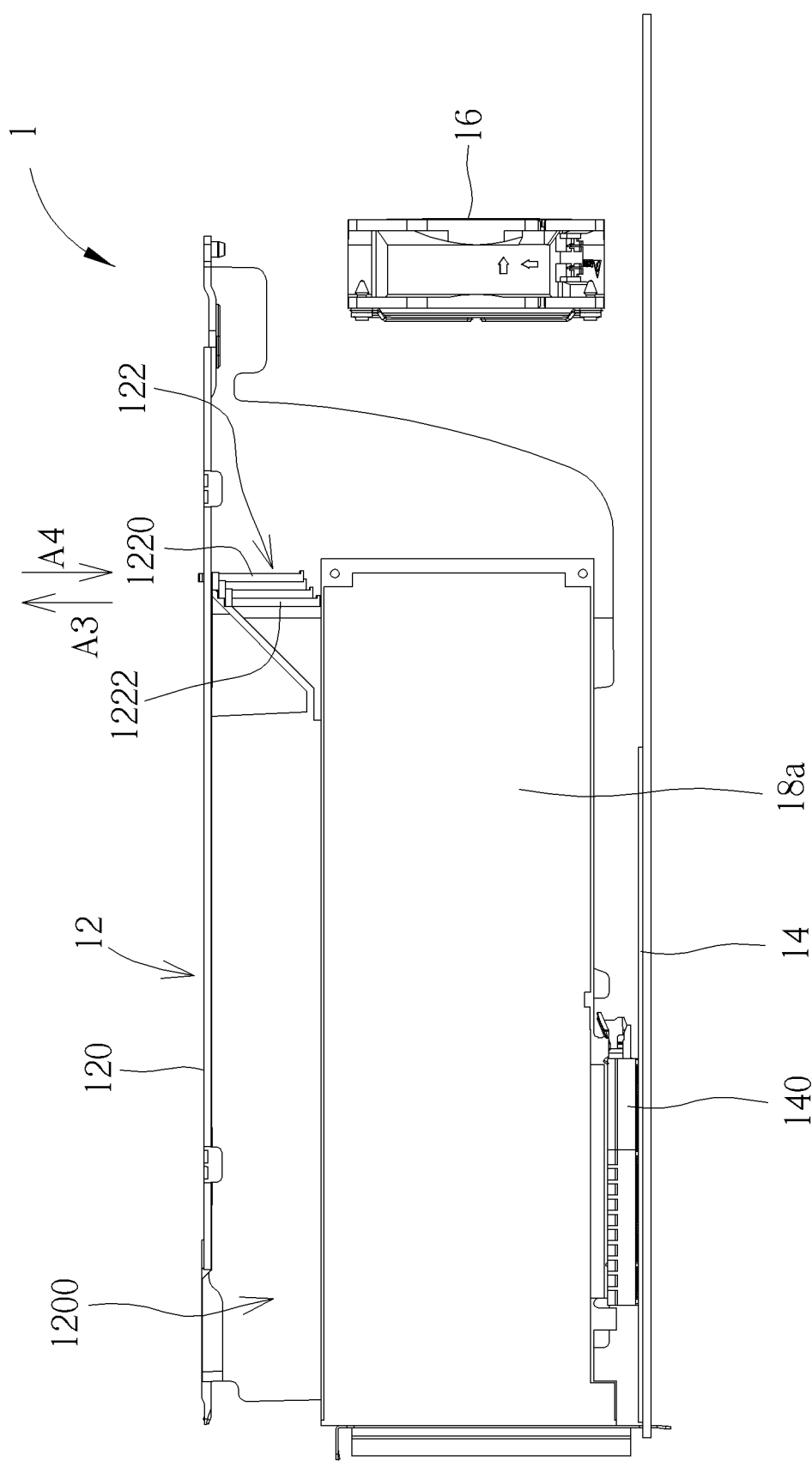
FIG. 5 is a side view illustrating the interface card and the corresponding shielding assembly shown in FIG. 4.
Figure 6:
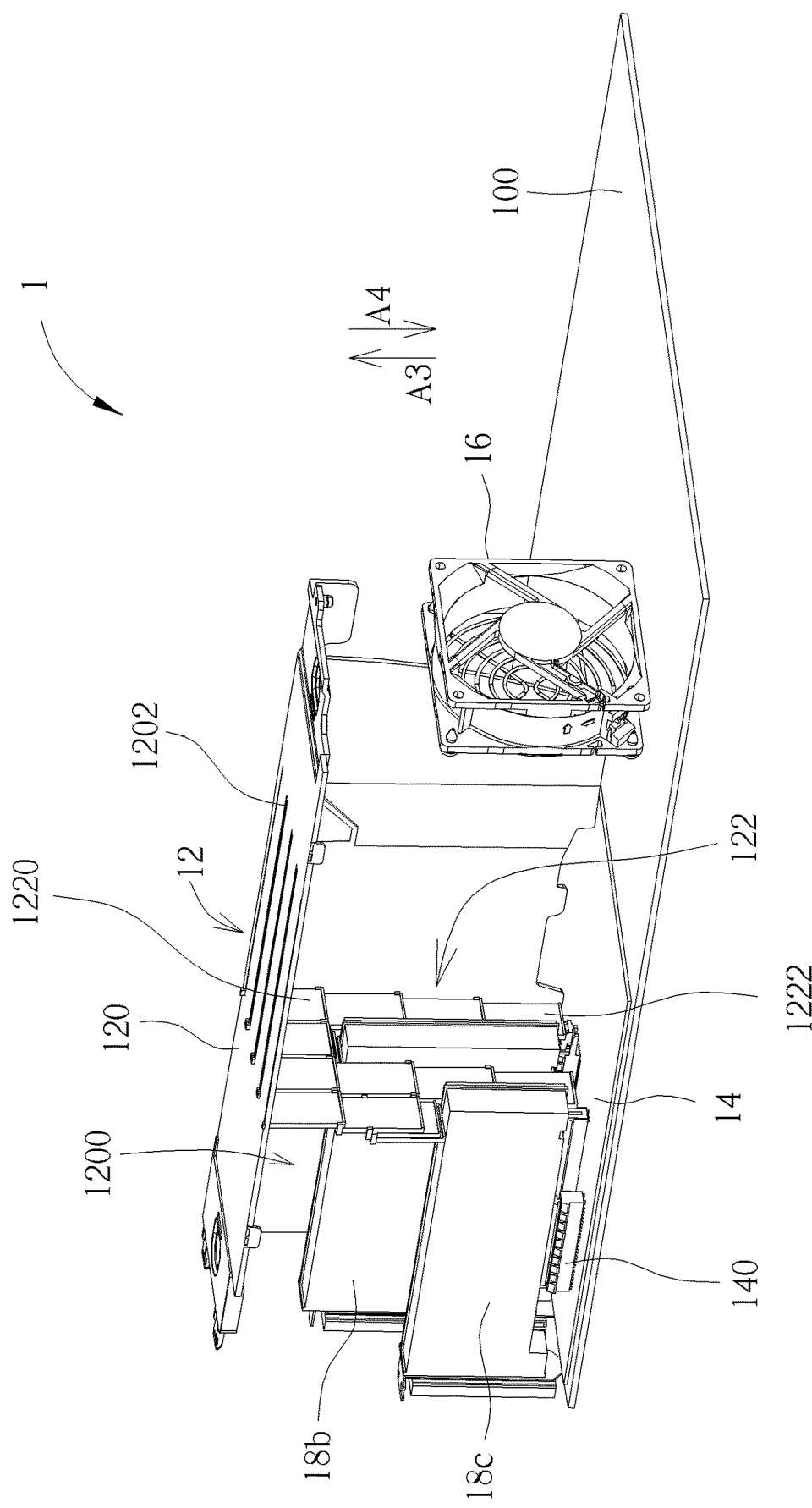
FIG. 6 is a perspective view illustrating two interface cards installed at the corresponding slots.
Figure 7:
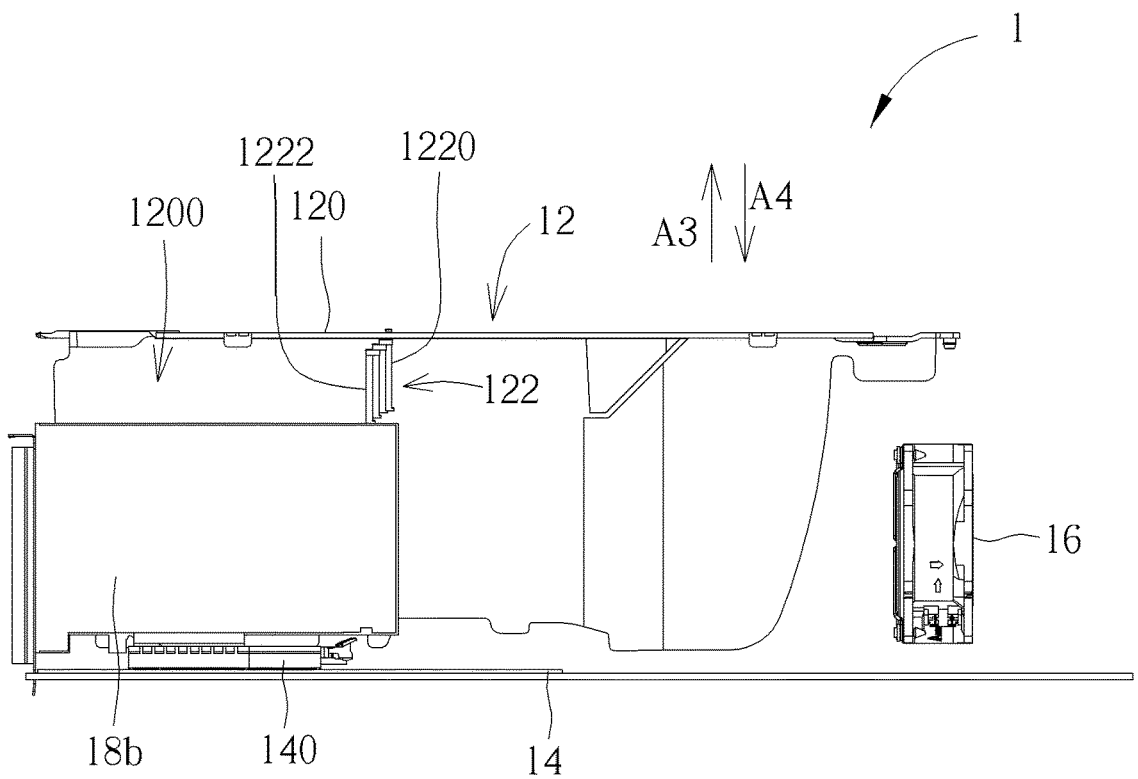
FIG. 7 is a side view illustrating the interface card and the corresponding shielding assembly shown in FIG. 6.
Figure 8:
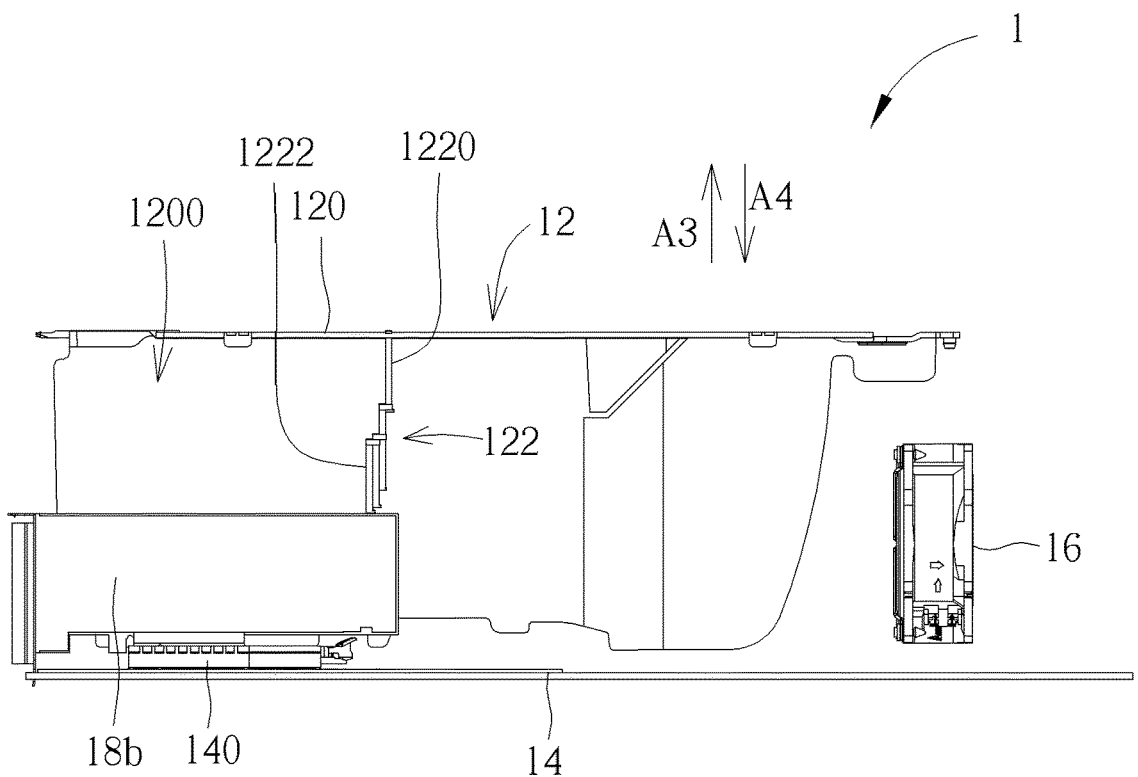
FIG. 8 is a side view illustrating the interface card and the corresponding shielding assembly shown in FIG. 6.

Referring to FIGS. 4 to 8, FIG. 4 is a perspective view illustrating an interface card 18a installed at the corresponding slot 140, FIG. 5 is a side view illustrating the interface card 18a and the corresponding shielding assembly 122 shown in FIG. 4, FIG. 6 is a perspective view illustrating two interface cards 18b, 18c installed at the corresponding slots 140, FIG. 7 is a side view illustrating the interface card 18b and the corresponding shielding assembly 122 shown in FIG. 6, and FIG. 8 is a side view illustrating the interface card 18c and the corresponding shielding assembly 122 shown in FIG. 6.

Since the shielding assembly 122 is movably connected to the guiding track 1202 of the housing 120, a user may drag the shielding assembly 122 to move within the airflow guiding portion 1200 along the guiding track 1202, so as to adjust the position of the shielding assembly 122 according to the interface cards 18a, 18b, 18c with different lengths, as shown in FIGS. 4 and 6. As shown in FIG. 5, when the user wants to install the interface card 18a with longer length, the user may move the shielding assembly 122 to a position corresponding to the length of the interface card 18*a* in advance. Then, the user may install the interface card 18*a* at the corresponding slot 140 first and then install the airflow guiding mechanism 12 on the circuit board 14. At this time, the second shielding plats 1222 of the corresponding shielding assembly 122 are pushed by the interface card 18*a* in the direction of the arrow A3. When the second shielding plates 1222 are pushed, the second shielding plates 1222 are stacked to be folded above the interface card 18*a* to open the airflow guiding portion 1200. At this time, the second shielding plates 1222 abut against the interface card 18*a* in the direction perpendicular to the interface card 18*a*. Accordingly, an airflow generated by the fan 16 will be guided to the interface card 18*a* for heat dissipation. On the other hand, when there is no interface card installed at the position corresponding to the shielding assembly 122, the second shielding plates 1222 of the shielding assembly 122 will be unfolded due to its own weight in the direction of the arrow A4 to shield the guiding portion 1200. Accordingly, the invention can prevent the airflow from losing from the position without an interface card, so as to effectively improve heat dissipating efficiency. Furthermore, the user does not need to unfold or fold the second shielding plates 1222 of the shielding assembly 122 manually, so the operation is quite convenient.

As shown in FIGS. 6 to 8, when the user wants to install the interface cards 18*b*, 18*c* with shorter length, the user may drag the shielding assembly 122 to move within the airflow guiding portion 1200 along the guiding track 1202 to the positions corresponding to the lengths of the interface cards 18*b*, 18*c*. Then, the user may install the interface cards 18*b*, 18*c* at the corresponding slots 140 first and then install the airflow guiding mechanism 12 on the circuit board 14. At this time, the second shielding plats 1222 of the corresponding shielding assemblies 122 are pushed by the interface cards 18*b*, 18*c* in the direction of the arrow A3. When the second shielding plates 1222 are pushed, the second shielding plates 1222 are stacked to be folded above the interface cards 18*b*, 18*c* to open the airflow guiding portion 1200. At this time, the second shielding plates 1222 abut against the interface cards 18*b*, 18*c* in the direction perpendicular to the interface cards 18*b*, 18*c*. Accordingly, an airflow generated by the fan 16 will be guided to the interface cards 18*b*, 18*c* for heat dissipation. As shown in FIG. 7, since the height of the interface card 18*b* is relatively high, three second shielding plates 1222 are pushed to be folded above the interface card 18*b*. As shown in FIG. 8, since the height of the interface card 18*c* is relatively low, two second shielding plates 1222 are pushed to be folded above the interface card 18*c*. In other words, when the second shielding plates 1222 are pushed by the interface cards with different heights, at least a part of the second shielding plates 1222 will be stacked to be folded above the interface card. On the other hand, when there is no interface card installed at the position corresponding to the shielding assembly 122, the second shielding plates 1222 of the shielding assembly 122 will be unfolded due to its own weight in the direction of the arrow A4 to shield the guiding portion 1200.

As shown in FIGS. 4 and 6, if there are lots of interface cards with different sizes in the airflow guiding portion 1200, the positions of the shielding assemblies 122 may be moved to abut against the interface cards with different sizes. In this embodiment, the airflow guiding effect is better by disposing the shielding assembly 122 at a front end of the interface card close to the fan, so the shielding assembly 122 in the figure is disposed at the end of the interface card close to the fan. In different embodiments, according to the requirement of the electronic device, the shielding assembly 122 may be moved along the guiding track 1202 to different positions for the interface cards with different sizes and airflow guiding requirements, and the second shielding plates 1222 may be moved with respect to the first shielding plate 1220 to abut against the interface cards with different heights. Furthermore, when there is no interface card installed at a region in the airflow guiding portion 1200, the first shielding plate 1220 and the at least one second shielding plate 1222 may jointly shield the airflow guiding portion 1200. As an embodiment shown in FIGS. 4 and 6, the first shielding plate 1220 and the second shielding plates 1222 shield the airflow guiding portion 1200 in a vertical arrangement, and the effect of shielding the airflow is achieved by the second shielding plate 1222 closest to the bottom 100 of the casing 10. However, the first shielding plate 1220 and the second shielding plates 1222 may also be arranged obliquely (not shown) instead of vertical arrangement, as long as the first shielding plate 1220 and the second shielding plates 1222 can jointly shield the airflow guiding portion 1200 for the region without interface card and a lower end of the second shielding plate 1222 abuts against the bottom 100 of the casing 10 to prevent airflow leakage.

Figure 9:
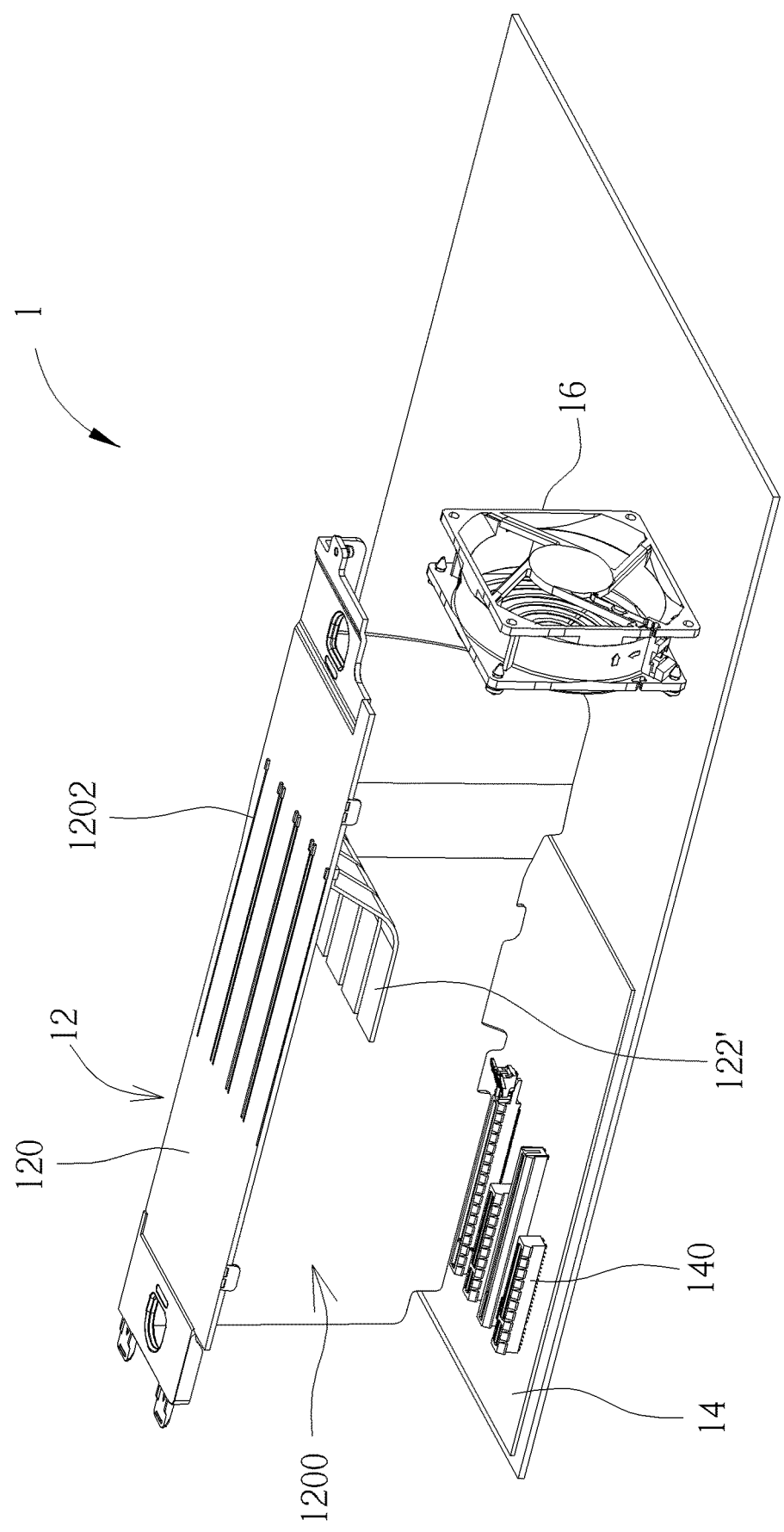
FIG. 9 is a perspective view illustrating the inside of the electronic device according to another embodiment of the invention.
Figure 10:
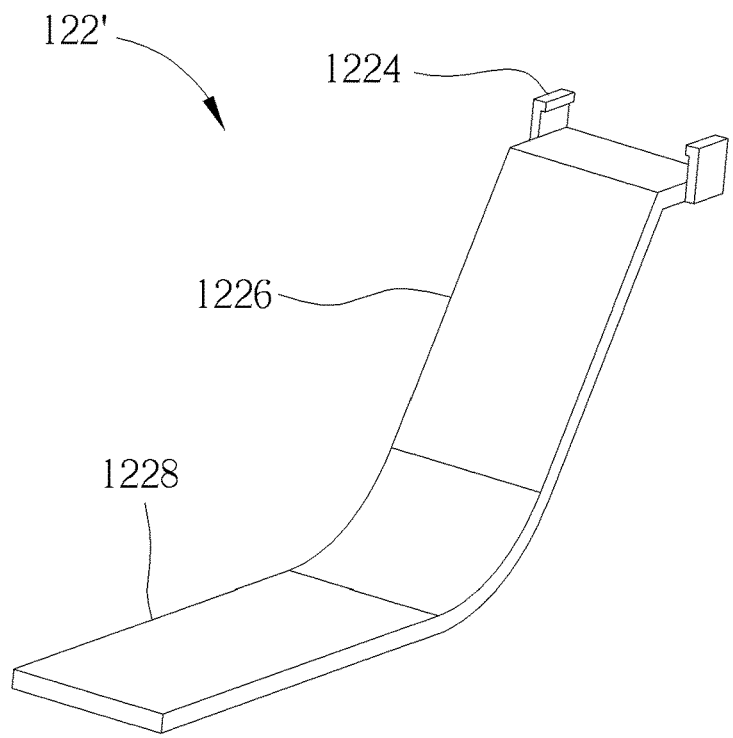
FIG. 10 is a perspective view illustrating a shielding assembly shown in FIG. 9.
Figure 11:
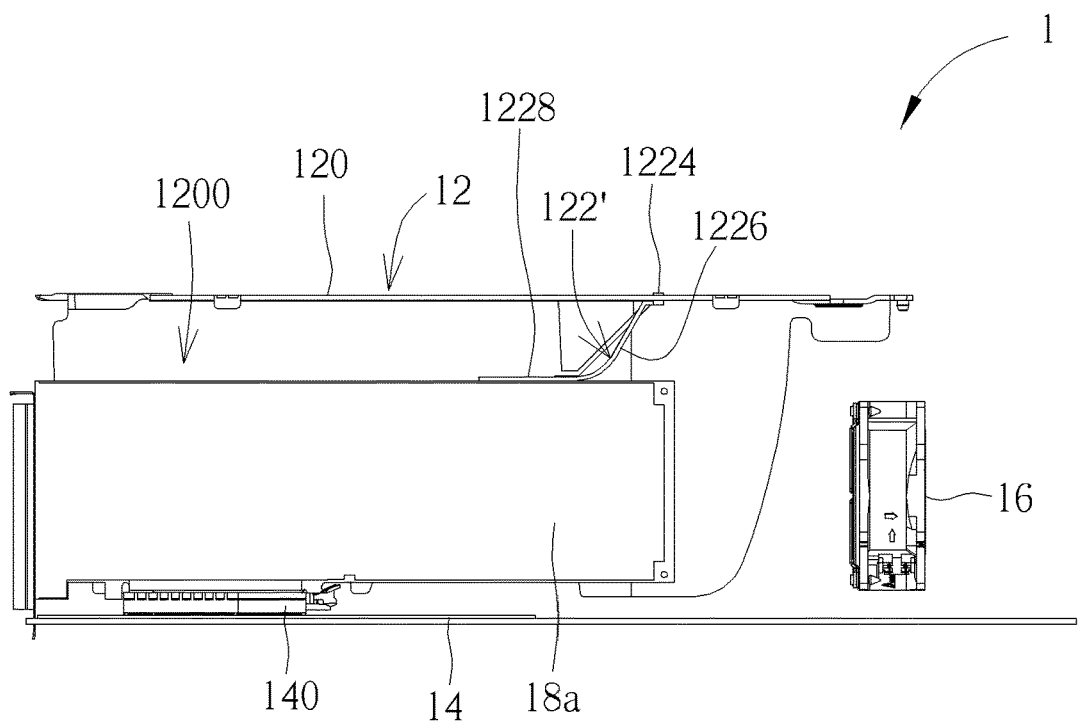
FIG. 11 is a side view illustrating the interface card and the corresponding shielding assembly.
Figure 12:
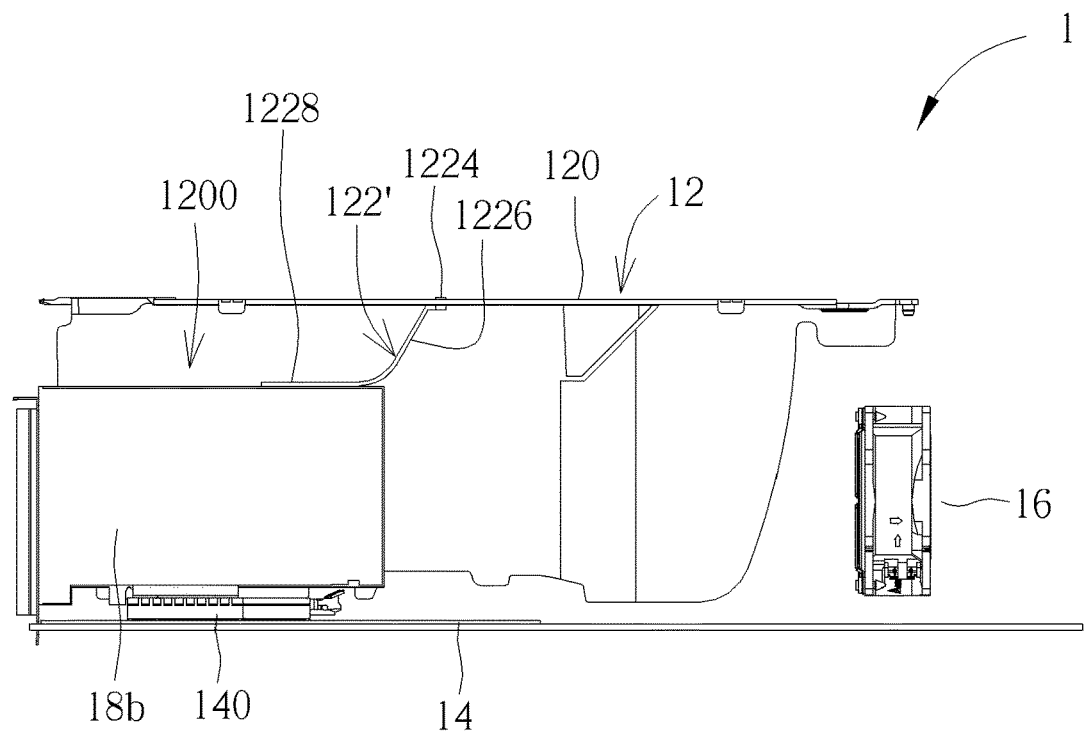
FIG. 12 is a side view illustrating the interface card and the corresponding shielding assembly.

Referring to FIGS. 9 to 12, FIG. 9 is a perspective view illustrating the inside of the electronic device 1 according to another embodiment of the invention, FIG. 10 is a perspective view illustrating a shielding assembly 122' shown in FIG. 9, FIG. 11 is a side view illustrating the interface card 18*a* and the corresponding shielding assembly 122', and FIG. 12 is a side view illustrating the interface card 18*b* and the corresponding shielding assembly 122'.

As shown in FIGS. 9 to 12, the electronic device 1 may replace the aforesaid shielding assembly 122 by the shielding assembly 122'. In this embodiment, the shielding assembly 122' comprises an engaging structure 1224, an elastic connecting portion 1226 and an abutting portion 1228, wherein the elastic connecting portion 1226 connects the engaging structure 1224 and the abutting portion 1228. In practical applications, the shielding assembly 122' may be an elastic sheet. The engaging structure 1224 is movably engaged with the guiding track 1202, such that the shielding assembly 122' is movably connected to the guiding track 1202. In this embodiment, the guiding track 1202 may comprise two sliding grooves in parallel and the engaging structure 1224 may comprise two opposite engaging hooks. The two engaging hooks are disposed in the two sliding grooves, such that the engaging structure 1224 is movably engaged with the guiding track 1202. In this embodiment, the engaging structure 1224 is exemplified by two engaging hooks. However, other structures capable of moving along the guiding track 1202 and being engaged with the guiding track 1202 may also be applied to the engaging structure 1224, such as emboss, I-shaped engaging structure, etc.

Since the shielding assembly 122' is movably connected to the guiding track 1202 of the housing 120, the user may drag the shielding assembly 122' to move within the airflow guiding portion 1200 along the guiding track 1202, so as to adjust the position of the shielding assembly 122' according to the interface cards 18*a*, 18*b* with different lengths, as shown in FIGS. 11 and 12. As shown in FIG. 11, when the user wants to install the interface card 18*a* with longer length, the user may move the shielding assembly 122' to a position corresponding to the length of the interface card 18*a* in advance. Then, the user may install the interface card 18*a* at the corresponding slot 140 first and then install the airflow guiding mechanism 12 on the circuit board 14. At this time, the abutting portion 1228 of the corresponding shielding assembly 122' abuts against the interface card 18a. In this embodiment, an included angle between the elastic connecting portion 1226 and the abutting portion 1228 of the shielding assembly 122' is an obtuse angle, but the invention is not so limited. In another embodiment, to strengthen the resistance to the interface card, the abutting portion 1228 may be moved close to the top of the slot 140 and the included angle between the elastic connecting portion 1226 and the abutting portion 1228 may be set as a right angle, i.e. the elastic connecting portion 1226 of the shielding assembly 122' vertically abuts against the top of the interface card away from the slot 140. Accordingly, the airflow generated by the fan 16 will be guided to the interface card 18a by the shielding assembly 122' for heat dissipation. As shown in FIG. 12, when the user wants to install the interface card 18b with shorter length, the user may drag the shielding assembly 122' to move within the airflow guiding portion 1200 along the guiding track 1202 to a position corresponding to the length of the interface card 18b. Then, the user may install the interface card 18b at the corresponding slot 140 first and then install the airflow guiding mechanism 12 on the circuit board 14. At this time, the abutting portion 1228 of the corresponding shielding assembly 122' abuts against the interface card 18b. Accordingly, the airflow generated by the fan 16 will be guided to the interface card 18b by the shielding assembly 122' for heat dissipation.

When there is no interface card installed at a position corresponding to the shielding assembly 122', the user may push the abutting portion 1228 of the shielding assembly 122' downward with respect to the elastic connecting portion 1226, so as to make the shielding assembly 122' shield the airflow guiding portion 1200. That is to say, the elastic connecting portion 1226 and the abutting portion 1228 of the shielding assembly 122' will jointly shield the airflow guiding portion 1200 (not shown). Accordingly, the invention can prevent the airflow from losing from the position without an interface card, so as to effectively improve heat dissipating efficiency. Similar to the first embodiment, the elastic connecting portion 1226 and the abutting portion 1228 of the shielding assembly 122' may be perpendicular, not perpendicular, or parallel (i.e. the butting portion 1228 may be bent with respect to the elastic connecting portion 1226 to form a folding state as shown in FIG. 7). It should be noted that the included angle between the elastic connecting portion 1226 and the abutting portion 1228 is not limited, as long as the elastic connecting portion 1226 and the abutting portion 1228 of the shielding assembly 122' can jointly shield the airflow guiding portion 1200 for the region without interface card. When the interface cards 18a, 18b are installed at the corresponding slots 140, the abutting portion 1228 of the shielding assembly 122' may be pushed or bent by the interface cards 18a, 18b with respect to the elastic connecting portion 1226, such that the abutting portion 1228 abuts against the top of the interface card, as shown in FIGS. 11 and 12. By means of the aforesaid manner, the shielding assembly 122' may be used to abut against the interface cards with different sizes to prevent the airflow from losing.

Referring to FIG. 6 and replacing the shielding assembly 122 by the shielding assembly 122', similar to the first embodiment, the shielding assembly 122' of the second embodiment may be connected to a plurality of guiding tracks 1202, the interface cards with different sizes may be installed under the guiding tracks 1202, and no interface card is installed under some guiding tracks 1202. The shielding assembly 122' may move along the guiding track 1202 to abut against the interface card. The abutting portion 1228 may be bent with respect to the elastic connecting portion 1226 to abut against the top of the interface card according to the length of the interface card or, alternatively, the abutting portion 1228 may be bent to abut against the bottom 100 of the casing 10, such that the shielding assembly 122' shields the airflow guiding portion 1200.

Figure 13:
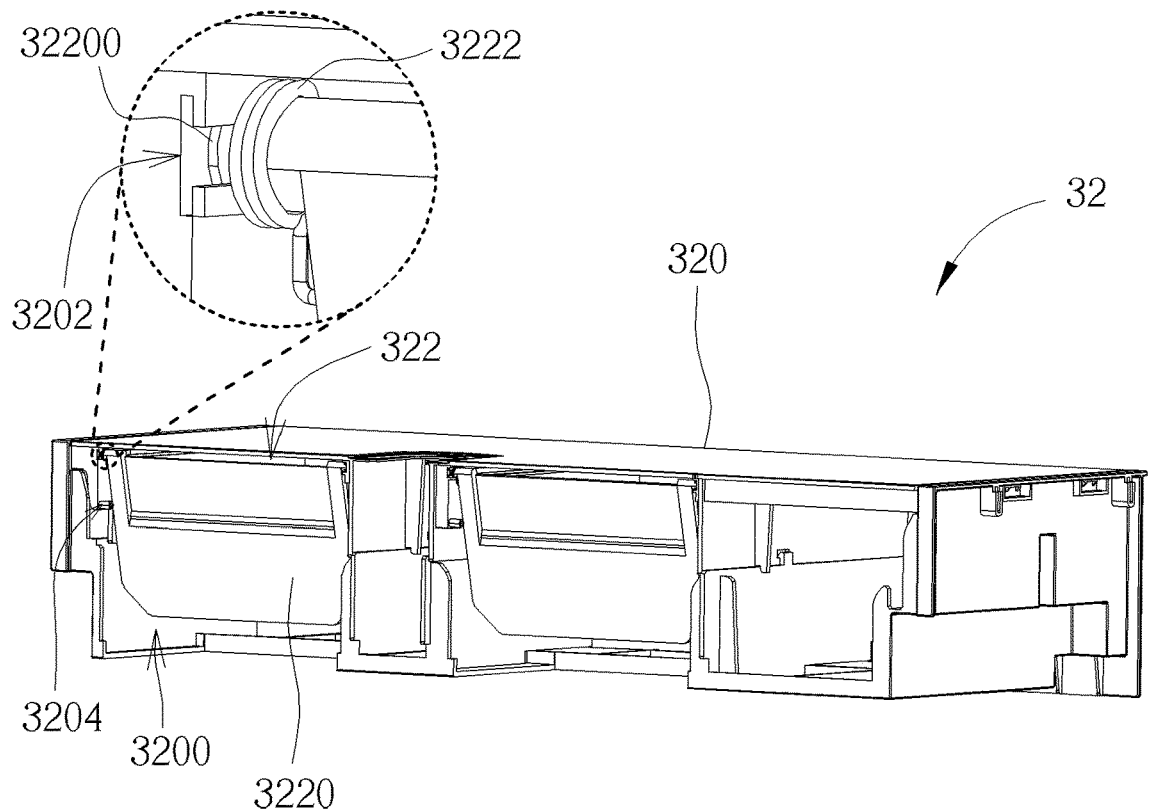
FIG. 13 is a perspective view illustrating an airflow guiding mechanism according to another embodiment of the invention.
Figure 14:
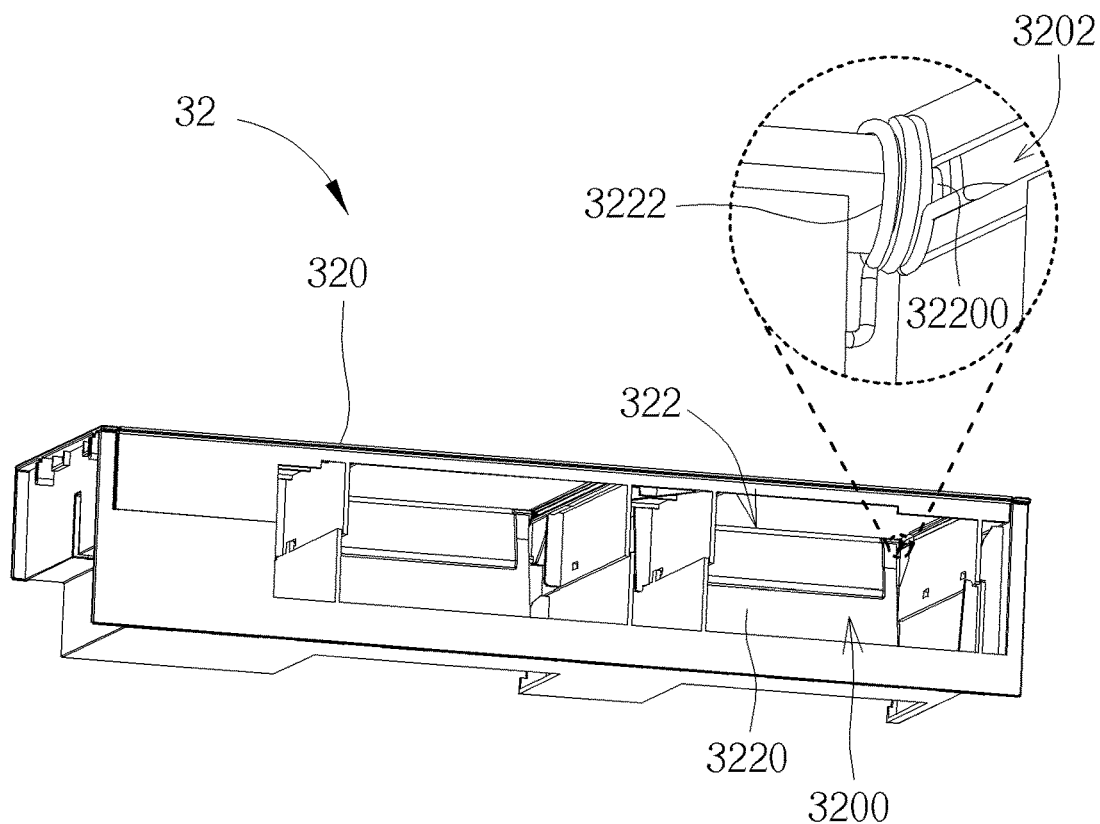
FIG. 14 is a perspective view illustrating the airflow guiding mechanism shown in FIG. 13 from another viewing angle.
Figure 15:
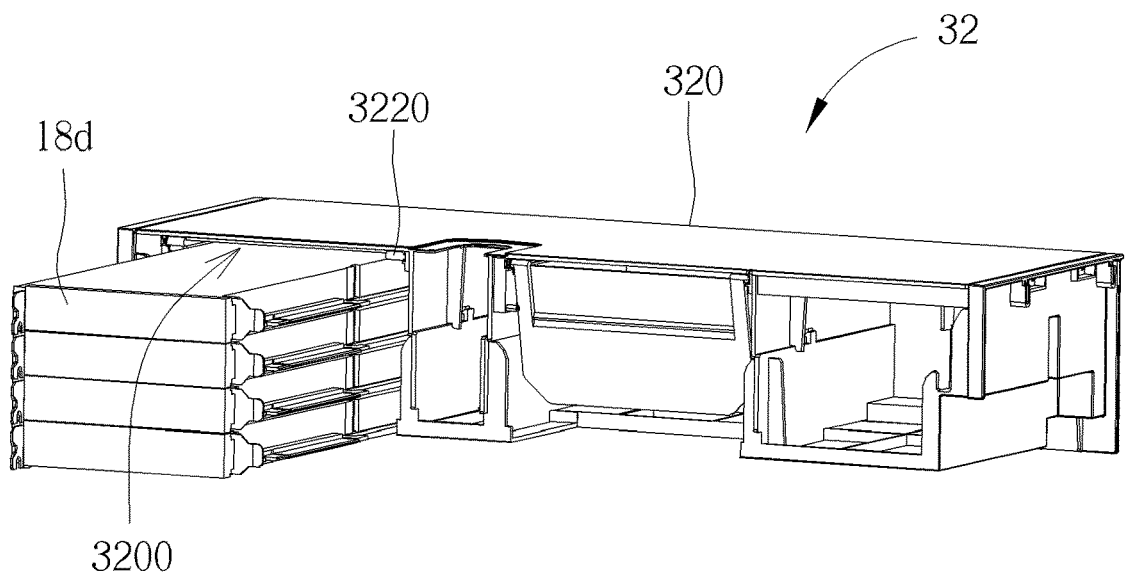
FIG. 15 is a perspective view illustrating an interface card installed in the airflow guiding mechanism shown in FIG. 13.
Figure 16:
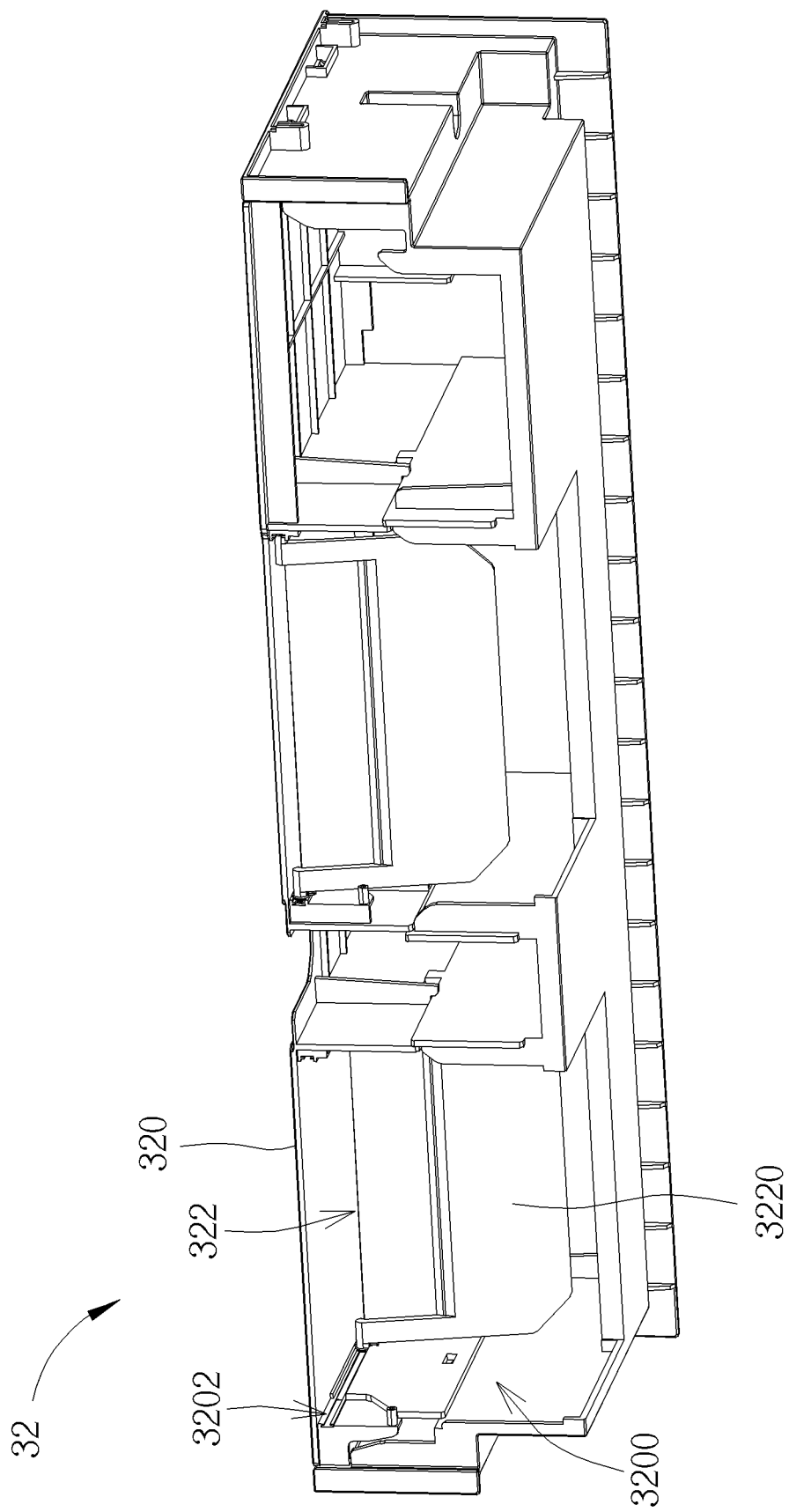
FIG. 16 is a perspective view illustrating a shielding plate shown in FIG. 13 moving along the guiding track.

Referring to FIGS. 13 to 16, FIG. 13 is a perspective view illustrating an airflow guiding mechanism 32 according to another embodiment of the invention, FIG. 14 is a perspective view illustrating the airflow guiding mechanism 32 shown in FIG. 13 from another viewing angle, FIG. 15 is a perspective view illustrating an interface card 18d installed in the airflow guiding mechanism 32 shown in FIG. 13, and FIG. 16 is a perspective view illustrating a shielding plate 3220 shown in FIG. 13 moving along the guiding track.

As shown in FIGS. 13 and 14, the airflow guiding mechanism 32 comprises a housing 320 and a shielding assembly 322. The aforesaid airflow guiding mechanism 12 may be replaced by the airflow guiding mechanism 32. The housing 320 comprises an airflow guiding portion 3200 and a guiding track 3202. The shielding assembly 322 is movably connected to the guiding track 3202, such that the shielding assembly 322 is able to move within the airflow guiding portion 3200 along the guiding track 3202. In this embodiment, the shielding assembly 322 comprises at least one shielding plate 3220 and a torsion spring 3222. A shaft portion 32200 of the shielding plate 3220 is movably and rotatably connected to the guiding track 3202. The torsion spring 3222 is disposed on the shaft portion 32200 of the shielding plate 3220 and opposite ends of the torsion spring 3222 respectively abut against the shielding plate 3220 and the housing 320. When there is no interface card installed in the airflow guiding portion 3200, an elastic force generated by the torsion spring 3222 drives the shielding plate 3220 to be closed with respect to the housing 320. In this embodiment, the housing 320 further comprises a retaining rod 3204. When the shielding plate 3220 is closed with respect to the housing 320, the retaining rod 3204 is configured to stop the shielding plate 3220 to restrain a rotating angle of the shielding plate 3220.

In this embodiment, the airflow guiding mechanism 32 may comprise two shielding plates 322 and the housing 320 may comprise two airflow guiding portions 3200 and two guiding tracks 3202. In this embodiment, the guiding track 3202 may comprise two sliding grooves located at opposite sides of the airflow guiding portion 3200 and the shielding plate 3220 may comprise two shaft portions 32200 located at opposite sides, wherein the two shaft portions 32200 are movably and rotatably disposed in the two sliding grooves. It should be noted that the number of the shielding plates 322, the airflow guiding portions 3200 and the guiding tracks 3202 may be determined according to practical applications, so the invention is not limited to the embodiment shown in the figures.

Since the shielding assembly 322 is movably connected to the guiding track 3202 of the housing 320, the user may drag the shielding assembly 322 to move within the airflow guiding portion 3200 along the guiding track 3202, so as to adjust the position of the shielding assembly 322 according to the interface cards with different lengths, as shown in FIGS. 13 and 16. As shown in FIG. 15, when the user wants to install an interface card 18d with longer length, the user may move the shielding assembly 322 to a position corresponding to the length of the interface card 18d in advance. Then, the user may install the interface card 18d in the corresponding airflow guiding portion 3200. At this time, the interface card 18d will push the shielding plate 3220 to rotate to be opened with respect to the housing 320. In this embodiment, there are four interface cards 18d stacked with each other, but the invention is not so limited. The number of the interface cards 18d may be determined according to practical applications. As shown in FIG. 16, when the user wants to install an interface card with shorter length (not shown), the user may drag the shielding assembly 322 to move within the airflow guiding portion 3200 along the guiding track 3202 to a position corresponding to the length of the interface card. On the other hand, when there is no interface card installed in the airflow guiding portion 3200, the elastic force generated by the torsion spring 3222 drives the shielding plate 3220 to be closed with respect to the housing 320. Accordingly, the invention can prevent the airflow from losing from the position without an interface card, so as to effectively improve heat dissipating efficiency.

Figure 17:
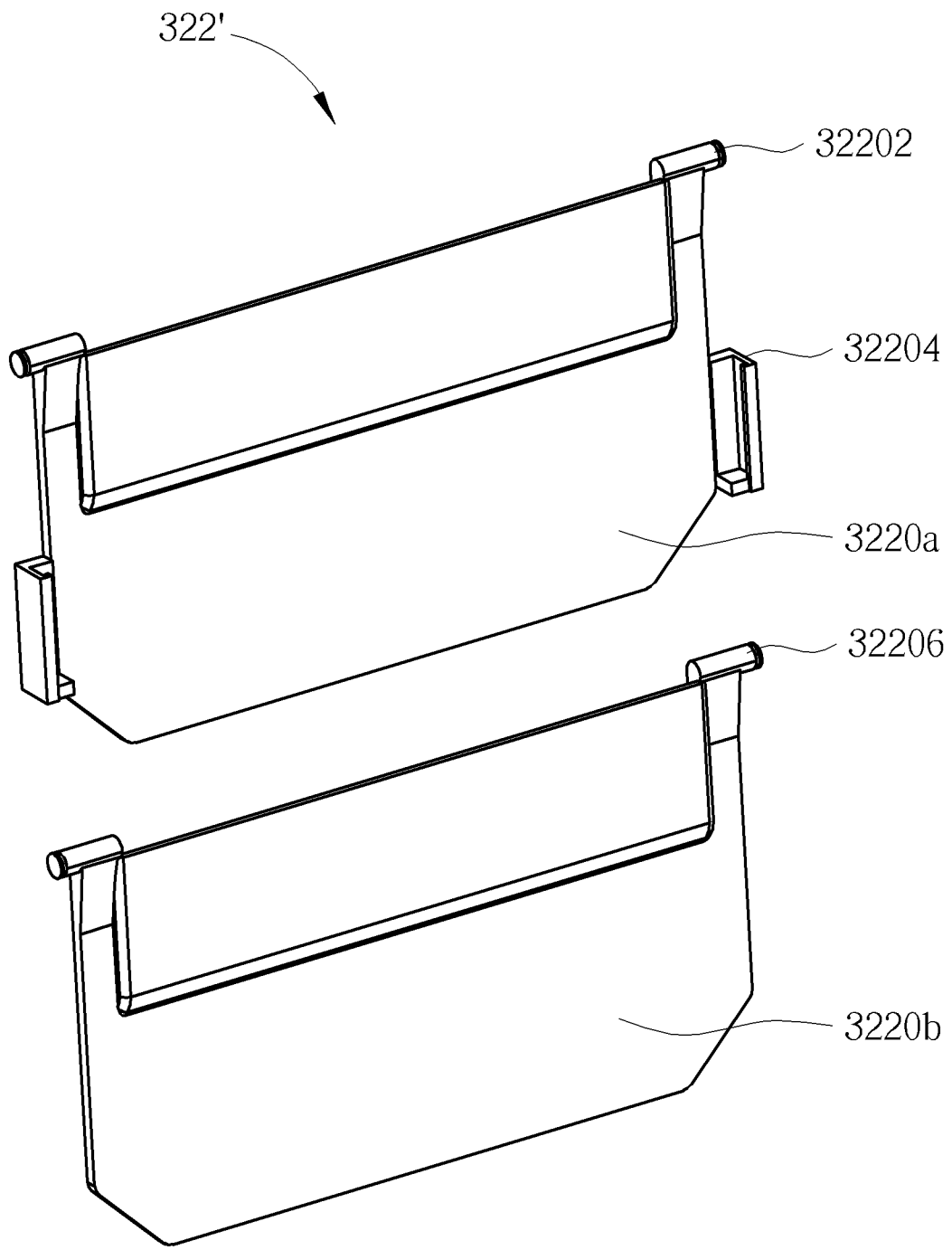
FIG. 17 is an exploded view illustrating a shielding assembly according to another embodiment of the invention.

Referring to FIG. 17, FIG. 17 is an exploded view illustrating a shielding assembly 322' according to another embodiment of the invention. As shown in FIG. 17, the shielding assembly 322' comprises a first shielding plate 3220a and a second shielding plate 3220b. The shielding assembly 322 shown in FIGS. 13 to 16 may be replaced by the shielding assembly 322' shown in FIG. 17. At this time, a first shaft portion 32202 of the first shielding plate 3220a is movably and rotatably connected to the guiding track 3202 of the housing 320. It should be noted that the size of the housing 320 may be redesigned according to the shielding assembly 322'. Furthermore, the torsion spring 3222 may also be disposed on the first shaft portion 32202 of the first shielding plate 3220a, such that the elastic force generated by the torsion spring 3222 drives the first shielding plate 3220a to be closed with respect to the housing 320.

In this embodiment, the first shielding plate 3220a has a sliding groove 32204 and a second shaft portion 32206 of the second shielding plate 3220b is movably and rotatably disposed in the sliding groove 32204. Accordingly, when an interface card with lower height is installed at a position corresponding to the shielding assembly 322', the interface card will push the second shielding plate 3220b to move and/or rotate with respect to the first shielding plate 3220a, such that the second shielding plate 3220b is opened with respect to the housing 320. When an interface card with higher height is installed at a position corresponding to the shielding assembly 322', the interface card will push the second shielding plate 3220b to move and/or rotate with respect to the first shielding plate 3220a first and then push the first shielding plate 3220a to rotate, such that the first shielding plate 3220a and the second shielding plate 3220b are opened with respect to the housing 320. In a region without interface card, similar to the first and second embodiments, the first shielding plate 3220a and the second shielding plate 3220b will jointly shield the airflow guiding portion 3200. In an embodiment, to strengthen the resistance of the shielding assembly 322' to the interface card, the shielding assembly 322' may be moved to a position above the slot and the first shielding plate 3220a vertically abuts against the top of the interface card (i.e. an included angle between the first shielding plate 3220a and the second shielding plate 3220b is a right angle).

As mentioned in the above, the shielding assembly of the invention is movably connected to the guiding track of the housing, such that the shielding assembly is able to move within the airflow guiding portion along the guiding track. Accordingly, a user may adjust the position of the shielding assembly according to interface cards with different sizes. In an embodiment, the shielding assembly may comprise a first shielding plate and at least one second shielding plate movably connected to each other. When there is an interface card installed at a position corresponding to the shielding assembly, at least a part of the at least one second shielding plate will be pushed by the interface card to be folded to open the guiding portion. On the other hand, when there is no interface card installed at a position corresponding to the shielding assembly, the at least one second shielding plate will be unfolded due to its own weight to shield the guiding portion. Accordingly, the invention can prevent the airflow from losing from the position without an interface card, so as to effectively improve heat dissipating efficiency. In other embodiments, the shielding assembly may also be an elastic sheet or rotatable shielding plate according to practical applications.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An airflow guiding mechanism comprising:
a housing comprising an airflow guiding portion and a guiding track; and
a shielding assembly movably connected to the guiding track, the shielding assembly being able to move within the airflow guiding portion along the guiding track;
wherein the shielding assembly comprises an engaging structure, an elastic connecting portion and an abutting portion, the elastic connecting portion connects the engaging structure and the abutting portion, and the engaging structure is movably engaged with the guiding track.

2. An airflow guiding mechanism comprising:
a housing comprising an airflow guiding portion; and
a shielding assembly comprising a first shielding plate and at least one second shielding plate, the first shielding plate being connected to the housing, the at least one second shielding plate and the first shielding plate being movably connected to each other, the at least one second shielding plate being able to move with respect to the first shielding plate to be folded and unfolded, so as to open and shield the airflow guiding portion;
wherein each of the at least one second shielding plate comprises a second engaging structure, the second engaging structure forms a sliding groove, the first shielding plate and each of the at least one second shielding plate are continuously slidably arranged in the sliding grooves correspondingly without being fixed by the second engaging structures.

3. The airflow guiding mechanism of claim 2, wherein the housing comprises a guiding track, the first shielding plate is movably engaged with the guiding track, and a moving direction of each of the at least one second shielding plate is perpendicular to a moving direction of the first shielding plate along the guiding track.

4. The airflow guiding mechanism of claim 2, wherein the first shielding plate and each of the at least one second shielding plate respectively comprise a flange; when each of the at least one second shielding plate is unfolded, the flange stops the second engaging structure to restraining each of the at least one second shielding plate.

5. The airflow guiding mechanism of claim 2, wherein when the at least one second shielding plate is pushed, at least a part of the at least one second shielding plate is stacked to be folded.

6. The airflow guiding mechanism of claim 2, wherein the housing comprises a guiding track, a first shaft portion of the first shielding plate is movably and rotatably connected to the guiding track, the first shielding plate has a sliding groove, and a second shaft portion of the second shielding plate is movably and rotatably disposed in the sliding groove.

7. The airflow guiding mechanism of claim 2, wherein the housing comprises a guiding track, the first shielding plate comprises a first engaging structure, and the first engaging structure is movably engaged with the guiding track.

8. An electronic device comprising:
   a casing; and
   an airflow guiding mechanism disposed in the casing, the airflow guiding mechanism comprising:
     a housing comprising an airflow guiding portion and a guiding track; and
     a shielding assembly movably connected to the guiding track, the shielding assembly being able to move within the airflow guiding portion along the guiding track;
   wherein the shielding assembly comprises a shielding plate and a torsion spring, a shaft portion of the shielding plate is movably and rotatably connected to the guiding track, the torsion spring is disposed on the shaft portion, and opposite ends of the torsion spring respectively abut against the shielding plate and the housing.

9. The electronic device of claim 8, wherein the housing comprises a retaining rod; when the shielding plate is closed with respect to the housing, the retaining rod stops the shielding plate.

* * * * *